(12) United States Patent
Stites

(10) Patent No.: US 8,830,590 B2
(45) Date of Patent: Sep. 9, 2014

(54) UNIT MAGNIFICATION LARGE-FORMAT CATADIOPTRIC LENS FOR MICROLITHOGRAPHY

(71) Applicant: Ultratech, Inc., San Jose, CA (US)

(72) Inventor: David G. Stites, St. Petersburg, FL (US)

(73) Assignee: Ultratech, Inc., San Jose, CA (US)

( * ) Notice: Subject to any disclaimer, the term of this patent is extended or adjusted under 35 U.S.C. 154(b) by 8 days.

(21) Appl. No.: 13/897,514

(22) Filed: May 20, 2013

(65) Prior Publication Data

US 2013/0321935 A1    Dec. 5, 2013

Related U.S. Application Data

(60) Provisional application No. 61/653,020, filed on May 30, 2012.

(51) Int. Cl.
| | | |
|---|---|---|
| *G02B 3/00* | (2006.01) | |
| *G02B 9/00* | (2006.01) | |
| *G02B 27/02* | (2006.01) | |
| *G03B 27/42* | (2006.01) | |
| *G03B 21/14* | (2006.01) | |

(52) U.S. Cl.
USPC .......... 359/649; 359/651; 359/726; 359/727; 359/728; 359/730; 359/733; 359/737; 359/798; 355/53; 355/67; 353/100; 353/122

(58) Field of Classification Search
USPC ......... 359/649, 651, 726–728, 733–736, 730, 359/737, 798; 355/53, 67, 71; 353/100, 122
See application file for complete search history.

(56) References Cited

U.S. PATENT DOCUMENTS

| | | | |
|---|---|---|---|
| 1,401,345 A | 12/1921 | Mechau | |
| 1,783,998 A | 12/1930 | Chretien | |
| 2,742,817 A | 4/1956 | Altman | |
| 5,805,356 A | 9/1998 | Chiba | |
| 5,969,803 A | 10/1999 | Mercado | |
| 6,813,098 B2 | 11/2004 | Mercado | |
| 6,863,403 B2 | 3/2005 | Mercado et al. | |
| 6,879,383 B2 | 4/2005 | Mercado | |
| 6,985,286 B2 * | 1/2006 | Shafer et al. | 359/365 |
| 7,006,304 B2 * | 2/2006 | Epple et al. | 359/727 |
| 7,116,496 B1 | 10/2006 | Mercado | |
| 7,148,953 B2 | 12/2006 | Mercado | |
| 7,177,099 B2 | 2/2007 | Mercado et al. | |
| 7,359,036 B2 * | 4/2008 | Dodoc | 355/67 |

(Continued)

OTHER PUBLICATIONS

J. Dyson, "Unit Magnification Optical System without Seidel Aberrations," *Journal of the Optical Society of America*, Jul. 1959.

(Continued)

*Primary Examiner* — Evelyn A. Lester
(74) *Attorney, Agent, or Firm* — Opticus IP Law PLLC

(57) ABSTRACT

A unit magnification Wynn-Dyson lens for microlithography has an image field sized to accommodate between four and six die of dimensions 26 mm×36 mm. The lens has a positive lens group that consists of either three or four refractive lens elements, with one of the lens elements being most mirror-wise and having a prism-wise concave aspheric surface. Protective windows respectively reside between object and image planes and the corresponding prism faces. The lens is corrected for at least the i-line LED wavelength spectrum or similar LED-generated wavelengths.

20 Claims, 15 Drawing Sheets

(56) References Cited

U.S. PATENT DOCUMENTS

| | | | |
|---|---|---|---|
| 7,573,655 B2 * | 8/2009 | Shafer | 359/727 |
| 7,609,455 B2 * | 10/2009 | Omura et al. | 359/649 |
| 8,493,670 B2 * | 7/2013 | Mercado | 359/726 |
| 2011/0235167 A1 * | 9/2011 | Shafer et al. | 359/365 |

OTHER PUBLICATIONS

Zhang Yudong et al., "A new family of 1:1 catadioptric broadband deep UV high NA lithography lenses," *SPIE* 1463 (1991): 688-694.

R.M.H. New et al., "Analytic optimization of Dyson optics," *Optical Society of America* 31 "Applied Optics," No. 10: 1444-1449, (Apr. 1992).

Zhang et al., "Some Developments for a Unit Magnification Optical System," published by the Optical Society of America, *Applied Optics* 34, No. 7, Mar. 1, 1995.

Flores et al., "Lithographic performance of a new generation i-line optical system: A comparative analysis," *Proc. SPIE* 1927, Optical/Laser Microlithography, 899 (Aug. 8, 1993).

* cited by examiner

UNIT MAGNIFICATION LARGE-FORMAT CATADIOPTRIC LENS FOR MICROLITHOGRAPHY

CLAIM OF PRIORITY

This application claims the benefit of priority under 35 U.S.C. §119(e) of U.S. Provisional Application Ser. No. 61/653,020, filed on May 30, 2012, which is incorporated herein by reference.

FIELD

The disclosure relates to lenses for microlithography, and in particular to a unit-magnification, catadioptric lens for microlithography that has a large field for accommodating multiple die.

BACKGROUND ART

Photolithography tools are used to print small features on semiconductor (e.g., silicon) wafers in the fabrication of integrated circuits (ICs). Photolithography tools are also used for back-end processes that involve, for example, forming patterns to define layer interconnects. Layer interconnects provide electrical power to drive the IC. The photolithography tools are also used in the back-end process to pattern metal pathways of the high-speed communication bus used to transmit control logic and data input/output (I/O) of the IC.

In the past two decades or so, the size of the silicon wafers used in manufacturing has grown from (200 mm) 8" to (300 mm) 12", with (450 mm) 16" now being considered. The IC manufacturing cost is related to two key factors: yield and throughput (i.e., wafers/hour). Assuming yield readily approaches 100%, the IC costs are largely defined by the throughput of the manufacturing process.

One way to increase throughput is to increase the die size on the wafer. Another way is to increase the number of die that can be imaged at one time. To do both, the photolithography tool needs to support multiple-die formats for large die so that the stepping (or scanning) time per wafer is reduced. This is more easily achieved in the coarser back-end layers that can be processed by unit-magnification (1×) photolithography tools.

What is needed is a robust but simple 1× projection optical system for a photolithography tool that operates at the i-line LED wavelength(s) and that has a field size capable of handling four to six die.

SUMMARY

An aspect of the disclosure is a microlithographic lens for imaging over an image field at an image plane a photomask (reticle) that defines a plurality of die at an object plane. The microlithographic lens includes along an optical axis: a concave mirror having an aspheric concave surface; a positive lens group spaced apart from the concave surface of the concave mirror; first and second total-internal-reflection (TIR) prisms disposed adjacent the positive lens group opposite the concave mirror and on respective sides of the optical axis, with the first prism having a first surface adjacent the object plane and the second prism having a second surface adjacent the image plane; wherein the positive lens group consists of either three or four air-spaced lens elements, with one of the lens elements being a most mirror-wise lens element having a positive meniscus shape and including a prism-wise concave aspheric surface; and wherein the image field is sized to include from four to six die, with each die having a nominal size of 26 mm×34 mm, the lens having substantially unit magnification at a numerical aperture of nominally 0.32, and wherein the lens has a Strehl ratio of >0.95 over the image field for at least an i-line wavelength of light.

Another aspect of the disclosure is a microlithographic lens for imaging over an image field at an image plane a photomask that defines a plurality of die at an object plane. The microlithographic lens includes along an optical axis: a concave mirror having an aspheric concave surface; a positive lens group spaced apart from the concave surface of the concave mirror and consisting of three spaced-apart lens elements, including a most mirror-wise lens element having a positive meniscus shape and including a prism-wise concave aspheric surface; first and second total-internal-reflection (TIR) prisms disposed adjacent the positive lens group opposite the concave mirror and on respective sides of the optical axis, with the first prism having a first surface adjacent the object plane and the second prism having a second surface adjacent the image plane; and wherein the image field is sized to include six die, with each die having a nominal size of 26 mm×34 mm, the lens having substantially unit magnification at a numerical aperture of nominally 0.32, and wherein the lens has a Strehl ratio of >0.95 over the image field for either an i-line LED wavelength spectrum or for g-line, h-line and i-line light.

Another aspect of the disclosure is a microlithographic lens for imaging over an image field at an image plane a photomask that defines a plurality of die at an object plane. The microlithographic lens includes along an optical axis: a concave mirror having an aspheric concave surface; first and second total-internal-reflection (TIR) prisms disposed on respective sides of the optical axis, with the first prism having a first surface adjacent the object plane and the second prism having a second surface adjacent the image plane; a positive lens group spaced apart from the concave surface of the concave mirror and between the prisms and the concave mirror, the positive lens group consisting of four spaced-apart lens elements, including a most mirror-wise lens element that has a positive meniscus shape and a prism-wise concave aspheric surface and a most prism-wise lens element that has a prism-wise concave surface that resides adjacent the prisms; and wherein the image field is sized to include four die, with each die having a nominal size of 26 mm×34 mm, the lens having substantially unit magnification at a numerical aperture of nominally 0.32, and wherein the lens has a Strehl ratio of >0.95 over the image field for either an i-line LED wavelength spectrum or for g-line, h-line and i-line light.

Example embodiments of the optical system disclosed herein include the following design features:

Unit magnification at an NA of about 0.32 and a spectral range encompassing "actinic mercury arc" spectral lines of "g, h and i" (436, 405 and 365 nm) with bandwidths associated with i-line-only exposure with the i-line UV-LED (365 nm) spectral bandwidth of approximately 2 to 3× that of the Hg-arc and the ability to image simultaneously (i.e., expose) "g,h,i-lines" at the same time (i.e., using a GHI-s spectrum).

A field size that can accommodate four or six die of a nominal "die size" of 26×36 mm. The die orientation may be that which best suits the optical format for the most compact or best-performing optical system.

Distortion in some embodiments of <50 nm, while in other embodiments a distortion of <10 nm.

Telecentric ray bundles being required at the object plane (i.e., at the photomask or reticle) and at the image plane (i.e., the wafer). This was achieved without constraint in the normal course of optimization of the four-die embodiment. The six-die embodiment is substantially telecentric, i.e., includes such a small amount of non-telecentricity as to be considered negligible with respect to a change in image size with a change with focus.

One benefit of the small amount of non-telecentricity is that shifting focus at the object and image planes by equal amounts in the same direction along the optic axis allows the magnification of the system to be very slightly altered. This is advantageous because pattern overlay errors can be minimized thereby. In the case of a perfectly telecentric optical system, it is not possible to alter the magnification by adjusting the optics within without degrading focus and/or image quality.

An example amount of change in magnification due to the non-telecentricity of the system is up to about 5 parts per million (ppm).

DETAILED DESCRIPTION

Figure 1A:
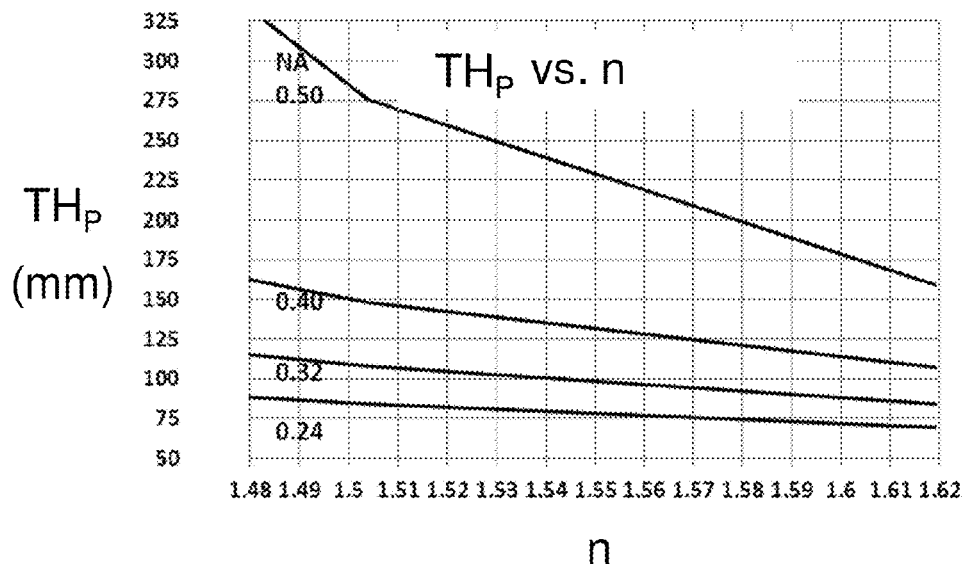
FIG. 1A is a plot of prism thickness $TH_P$ (mm) versus refractive index n for NA values of 0.24, 0.32, 0.40 and 0.50, and illustrates how the prism thickness increases with increasing NA.

The disclosure relates to lenses for microlithography, and in particular to a unit-magnification catadioptric lens for microlithography that has a large field for accommodating multiple die.

The claims as set forth below are incorporated into and constitute a part of this Detailed Description.

The terms "photomask" and "reticle" are used synonymously herein.

The term "die" as used in the art of semiconductor manufacturing refers to a portion of a semiconductor wafer on which a functional integrated circuit is fabricated. The term "die" as used herein also refers to a portion of the reticle that includes patterns used to form images on the wafer for the purpose of forming the die thereon. Thus, for ease of illustration and discussion, and because the optical systems disclosed herein have nominally unit magnification, the term "die" can refer to either the reticle die pattern or the die as formed in the wafer. An example reticle can have four to six die, as discussed below, so that four to six die can be imaged onto the wafer, i.e., the image and object fields of the optical system are sized to accommodate four die or six die in different embodiments. This is what is meant by a "four-die format" or a "six-die format." In an example, each dice has a nominal size of 26 mm×36 mm.

The term "mirror-wise" means "facing the mirror" and the term "prism-wise" means "facing the prisms." Thus, a lens that has a prism-wise concave surface has a concave surface that faces the prisms.

The following technical publications and patent documents are incorporated herein by reference:

J. Dyson, "Unit Magnification Optical System without Seidel Aberrations," *Journal of the Optical Society of America*, July 1959.

Zhang Yudong et al., "A new family of 1:1 catadioptric broadband deep UV high NA lithography lenses," *SPIE* 1463 (1991): 688-694.

R. M. H. New et al., "Analytic optimization of Dyson optics," *Optical Society of America* 31 "Applied Optics," no. 10: 1444-1449.

Zhang et al., "Some Developments for a Unit Magnification Optical System," published by the Optical Society of America, *Applied Optics* 34, no. 7, Mar. 1, 1995.

U.S. Pat. Nos. 1,401,345; 1,783,998; 2,742,817; 7,148,593; and 7,573,655.

Optical Design Considerations

Example 1× photolithography tools include catadioptric systems that image at mercury-arc wavelengths (g-line=436 nm; h-line=405 nm and i-line=365 nm) for producing 0.75 µm to 2 µm critical-dimension features on silicon wafers. More recently, the availability of UV light-emitting diodes (LEDs) has enabled the transition from mercury-arc lamps to more reliable solid-state sources such as LEDs for i-line wavelength imaging. An example i-line LED spectrum is about 9-nm wide (FWHM), ranges from about 357 nm to 374 nm and has a peak at 365 nm. The slightly broader i-line-LED spectrum imposes additional achromatizing requirements on the resulting image quality, necessitating more complex optical designs, especially at the larger multi-die format sizes required for higher wafer-throughput rates.

The optical system disclosed herein is based on the Wynn-Dyson design, which has a primary concave mirror centered on an optical axis and separation fold prisms on either side of the optical axis. The separation fold prisms are used to separate the object and image planes, which would otherwise overlap on the optical axis.

The optical design of a Wynn-Dyson optical system in the mid-UV actinic spectral region (365 nm to 435 nm) is limited to roughly a dozen highly transparent optical glasses plus one amorphous transparent ceramic and one transparent crystal, as denoted in Table 1 below. Table 1 sets forth example optical and thermal properties of sixteen candidate materials for the actinic spectral band.

TABLE 1

| Material | nnnvvv | τ,i (25 mm) | n,i (365 nm) | CTE × 10E⁻⁷/C (−30~+70) | dn/dT × 10⁻⁶/C i (20~40) |
|---|---|---|---|---|---|
| S-FPL51Y | 497811 | 0.993 | 1.511854 | 136 | −6.1 |
| S-FSL5Y | 487703 | 0.997 | 1.504044 | 89 | 0.1 |
| BSL7Y | 516643 | 0.995 | 1.535739 | 68 | 4.4 |
| BAL15Y | 557587 | 0.984 | 1.580115 | 76 | 4.6 |
| BAL35Y | 589612 | 0.990 | 1.612606 | 57 | 5.4 |
| BSM51Y | 603606 | 0.987 | 1.627426 | 63 | 4.7 |

TABLE 1-continued

| Material | nnnvvv | τ,i (25 mm) | n,i (365 nm) | CTE × 10E⁻⁷/C (−30~+70) | dn/dT × 10⁻⁶/C i (20~40) |
|---|---|---|---|---|---|
| PBL1Y | 548457 | 0.994 | 1.579306 | 93 | 5.0 |
| PBL6Y | 532490 | 0.994 | 1.559593 | 83 | 5.3 |
| PBL25Y | 581408 | 0.986 | 1.619284 | 87 | 7.0 |
| PBL26Y | 567428 | 0.989 | 1.602169 | 89 | 5.7 |
| PBM2Y | 620363 | 0.965 | 1.666350 | 86 | 9.3 |
| PBM8Y | 596393 | 0.977 | 1.636037 | 85 | 7.7 |
| PBM18Y | 596387 | 0.983 | 1.636558 | 88 | 8.4 |
| PBL35Y | 582409 | 0.993 | 1.619370 | 91 | 6.1 |
| Fused Silica | 458678 | 0.999 | 1.474555 | 0.49 | 11.2 |
| CaF2 | 434952 | 0.999 | 1.444893 | 18.7 | −10.6 |

Materials are available from a limited number of producers world-wide: Ohara Glass/JP for i-line glass types; Heraeus/DE and Corning/US for amorphous, transparent ceramic fused silica of various types and grades; and Corning/US and Helma/DE for cubic single-crystal calcium fluoride ($CaF_2$). Production of each material is achieved through combinations of melting, chemical vapor deposition or flame hydrolysis, or a suitable crystal-growing method. Only materials of the highest internal-refractive-index homogeneity (~1 ppm) are suitable, again due to their optical thickness, which tends to be quite large for systems of this type.

In Table 1, those materials with the highest optical transmission (>0.99/25 mm) are shown in bold in the first four columns and are the most suitable for thick lens elements, especially those in a ring-field catadioptric system where effective thickness is multiplied by 2× due to rays double-passing them between object (to and from the primary mirror) and image at the wafer. The column labeled "nnnvvv" refers to the MIL-code, which combines the first three decimals of the refractive index for the Helium d-line (587.6 nm) and the Abbe Number Vd, which indicates the relative spectral dispersion of each material in the visible spectrum. Dispersion increases at shorter wavelengths, especially in the UV, making achromatization more difficult despite the narrower 365-nm-to-435-nm spectral band as compared with a 450-nm-to-650-nm visible band. The value "τ,i(25 mm)" gives the internal transmission for a thickness of 25 mm and the value "n,i" gives the refractive index for the Mercury i-line (365 nm).

Thermal properties should also be considered when selecting materials, from the standpoint of temperature stability in use as well as during manufacture. Bold values indicate materials with interesting departures from the average CTE and dn/dT (temperature variation of refractive index), especially those with "zero" CTE (fused silica) and zero-to-negative dn/dT values.

Thick optical components are very sensitive to small temperature gradients that produce changes in surface geometry and refractive index (index gradients). Although Fused Silica is considered a low expansion material, it has the highest dn/dT value of sixteen candidate materials. $CaF_2$ has an equally high but negative dn/dT and an extremely high coefficient of thermal expansion (CTE), which makes it extremely susceptible to fracture if exposed to sudden temperature changes (especially cooling) during manufacture or use.

FIG. 1A is a plot of prism thickness $TH_P$ (mm) versus refractive index n for different values of the optical system NA, namely NA=0.24, 0.32, 0.40 and 0.50 for a 52-mm-high prism and a two-die system format.

Material selection for the separation fold prisms considers the optical behavior of each prism's internally reflecting surface, which is five to six times more sensitive to surface errors than its refracting surfaces. The wavefront error (WFE) associated with an internally reflected wavefront at normal incidence is given by:

$$WFE, rfl = 2 \cdot n \cdot e$$

while for normally incident refraction at a surface is given by:

$$WFE, rfr = (n-1) \cdot e.$$

where e is the surface error (in waves) and n is the refractive index at that wavelength.

The relative sensitivity of each to the other is:

$$\sigma = 2 \cdot n/(n-1),$$

with $\sigma = 6.54 \times$ for a low index of 1.44 and $\sigma = 5.3 \times$ for a higher value of n=1.61.

Another factor affecting material selection is whether the refractive index is high enough for all rays to undergo Total Internal Reflection (TIR) from the prism's reflecting face without the use of a reflection coating. When the angle of incidence falls below the critical angle, TIR fails. A reflection coating is then needed to prevent rays from refracting through the reflecting face, and vignetting of some of the image occurs.

The critical angle ($p_c$ beyond which TIR is assured is given by:

$$\phi_C \geq a \sin(1/n).$$

where $\phi$ is measured relative to the surface normal.

Figure 1B:
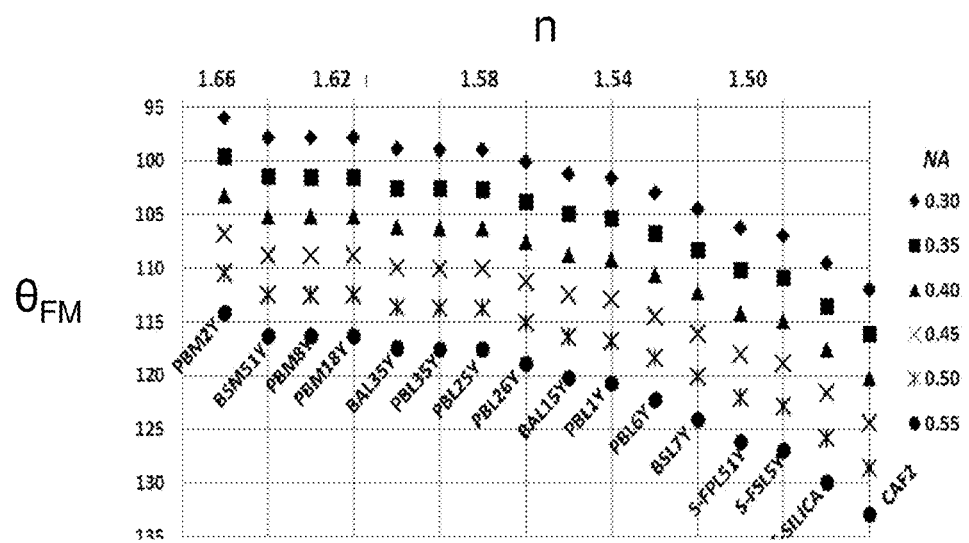
FIG. 1B is a plot of the minimum prism fold angle $\theta_{FM}$ (degrees) versus refractive index n at the i-line wavelength for a range of NAs from 0.3 to 0.55 and for a range of i-line optical glasses.

FIG. 1B is a plot of the minimum TIR fold angle $\theta_{FM}$ (inverted scale) for i-line materials (FIG. 2B, introduced below, shows how fold angle $\theta_F$ is measured). The minimum fold angle $\theta_{FM}$ that supports TIR is given by:

$$\theta_{FM} = 2 \cdot [a \sin(1/n) + a \sin(NA/n) + K]$$

where n is the refractive index at the longest wavelength to be supported, NA is the numerical aperture of the system and K is the additional allowance for establishing the design margin for departures from telecentricity and other tolerances. FIG. 1B is a plot of the minimum TIR fold angle $\theta_{FM}$ (degrees) versus the refractive index n (at i-line wavelength) for a number of i-line optical materials for NAs ranging from 0.30 to 0.55, as indicated in the legend on the plot.

The greater the fold angle OF, the thicker the prism becomes, which occurs as the value of the refractive index is decreased. The prism shape becomes non-optimum since extreme NA rays can no longer be made parallel internally relative to the entrance face of the prism. This increases the prism height and the prism thickness, which may be disadvantageous to the overall optics design.

The optimum prism fold angle $\theta_F$ is denoted $\theta_{FO}$ and is such that the lower refracted ray versus NA is parallel to the folded entrance face of the prism. The solution space can be defined in terms of the minimum fold angle $\theta_{FM}$ and the optimum fold angle $\theta_{FO}$:

$$(\theta_{FO} - \theta_{FM}) = 2 \cdot \{[45° + (\tfrac{1}{2}) \cdot a \sin(NA')] - \phi_C\} \text{ (in degrees)}$$

where NA' is the numerical aperture of the object (rays) refracted within the prism—e.g., a sin(1/n)—and n is the refractive index. The optimum critical angle $\phi_{CO}$ has a limited range of solution space—e.g., values>$\phi_C$ for NA>>0.24—and refractive index values above 1.54. Thicker and less compact prisms are required to support TIR for lower refractive indices or higher NA, and eventually higher NAs will fail altogether and necessitate adding a reflection coating on the prism face.

Ohara glass types satisfying the optimum critical angle $\phi_{CO}$ at 0.24 NA are limited to twelve glasses in the following Table 2. An even smaller number (underlined) satisfy the optimum critical angle $\phi_{CO}$ at 0.32 NA and none satisfy it for NAs>0.37.

TABLE 2

| GLASS | n |
|---|---|
| BSL7Y | 1.535739 |
| PBL6Y | 1.559593 |
| PBL1Y | 1.579306 |
| BAL15Y | 1.580115 |
| PBL26Y | 1.602169 |
| PBL25Y | 1.619284 |
| PBL35Y | 1.61937 |
| BAL35Y | 1.612606 |
| BSM51Y | 1.627426 |
| PBM18Y | 1.636558 |
| PBM8Y | 1.636037 |
| PBM2Y | 1.66635 |

The foregoing further suggests that the use of fused-silica or $CaF_2$ (the highest-transmission materials) are not necessarily the best choice for the prisms, especially when TIR 15 a requirement. Low-index prisms require larger fold angles, and their shapes depart from the optimum shape, accruing greater thicknesses than higher index materials require. The prism material may prevent the attainment of the optimum overall design in conjunction with all other combinations of materials and lens and mirror combinations, surface shapes, etc.

When a nominal prism geometry has been established based on a preferred material, its thickness is then optimized, along with the remaining lens design parameters (radii, thicknesses, air-spaces and aspheric terms). Prism thickness has a significant effect on spherical aberration and Petzval sum, as well as on other Seidel aberrations. Accordingly, it is allowed to be adjusted relative to its nominal geometry to fully optimize the lens design for various combinations of material types.

The optimization process is incremental, allowing substitution of all suitable glass types based on careful selection of the most suitable properties, primarily spectral transmission. Other factors such as cost (regarding fused-silica or $CaF_2$), thermal and manufacturing considerations should be similarly addressed.

The foregoing formulary can be coded into the lens design optimization merit-function of standard lens design software to allow the lens design software to dynamically bound and react to various constraints in the optics design. This permits the design software to search globally for the best combinations of materials based on an array of optimization parameters that guide the design beyond simply minimizing image criteria such as diffraction Point Spread Function (PSF) or Strehl Ratio. Other factors, such as distortion and telecentricity, must be monitored and constrained when necessary. Polarization effects in TIR are dealt by applying a phase-preservation coating on the prism reflecting face if phase-shift variation for non-polarized light (LED or arc-lamp) is large enough to degrade image quality.

The application of the above considerations is used in setting forth two example embodiments for a 1× Wynn-Dyson optical system, both at a NA of 0.32: one for a four-die format at i-line-LED and GHI-simultaneous (GHI-s) spectra, and another for a six-die format optimized for i-line-LED only.

First Example Embodiment

Figure 2A:
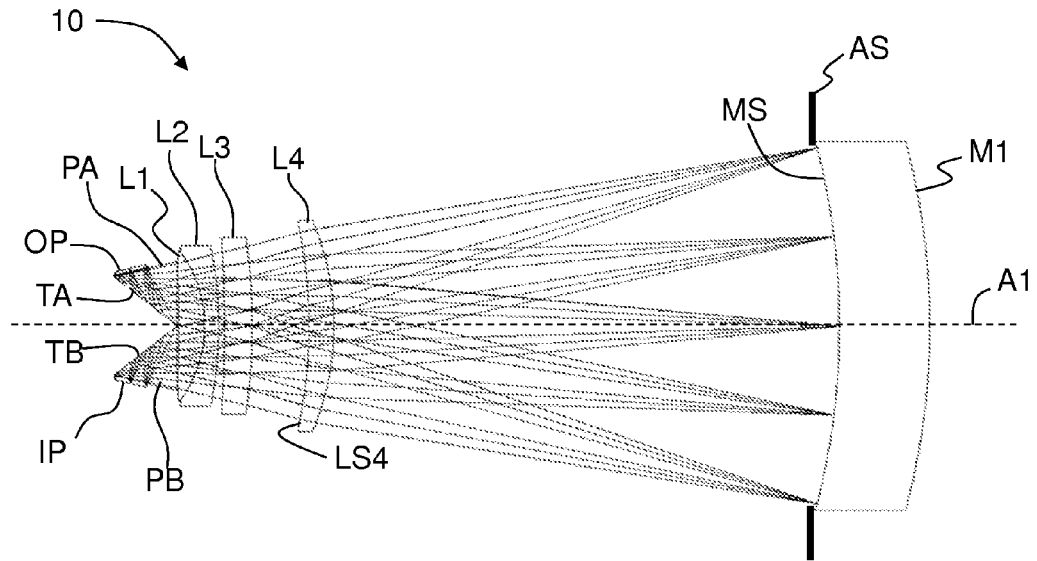
FIG. 2A is a diagram of a first example embodiment of a 1× modified Wynn-Dyson catadioptric optical system according to the disclosure.

FIG. 2A is a diagram of a first example embodiment of a 1× modified Wynn-Dyson catadioptric optical system ("system") 10 according to the disclosure. The system 10 includes a primary concave mirror M1 centered on an optical axis A1. The mirror M1 has a mirror surface MS. An aperture stop AS is located at mirror surface MS. The system 10 includes four refractive lens elements L1 through L4 arranged along axis A1 on the concave side of mirror M1 and axially spaced apart from mirror surface MS. The system 10 includes separation fold prisms ("prisms") PA and PB that each reside adjacent lens L1 but on opposite sides of optical axis A1. The prisms PA and PB have respective TIR surfaces TA and TB that serve to fold system 10 so that an image plane IP and an object plane OP do not overlap on axis A1.

Figure 2B:
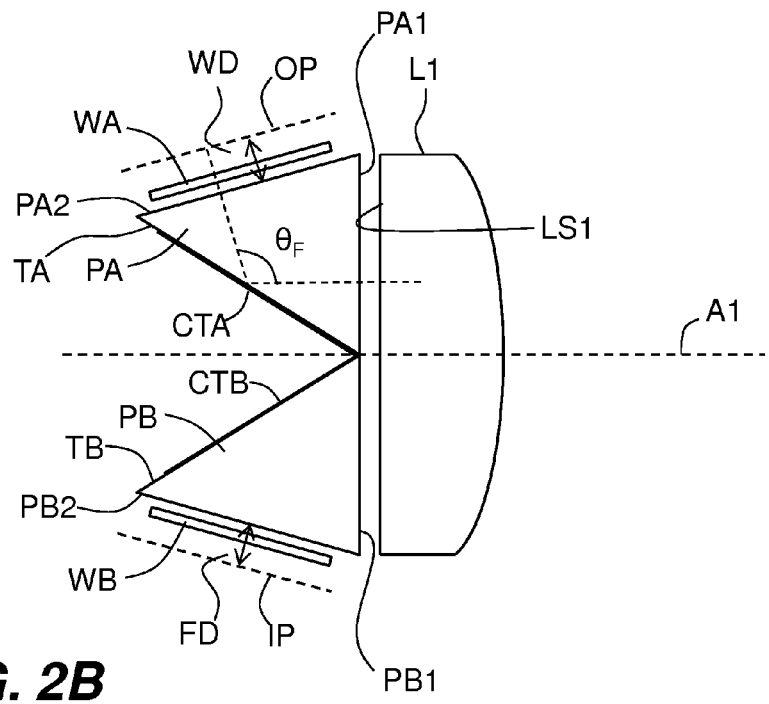
FIG. 2B is a close-up view of the prisms and first lens element of the first example embodiment and shows the protective windows between the respective prisms and the image and object planes, and also illustrates the fold angle $\theta_F$.

FIG. 2B is a close-up view of prisms PA and PB and the respective object and image planes OP and IP. The prism PA includes a planar surface PA1 adjacent a lens surface LS1 of lens element L1. The prism PA also includes a planar surface PA2 closest to object plane OP. Likewise, prism PB includes a planar surface PB1 adjacent lens surface LS1 of lens element L1. The prism PB also includes a planar surface PB2 closest to image plane IP. FIG. 2B also shows the aforementioned phase-preservation coatings CTA and CTB on TIR surfaces TA and TB.

In an example, system 10 includes a thin (e.g., nominally 1 mm thick) protective window WA disposed between prism surface PA2 and object plane OP, and a thin protective window WB disposed between prism surface PB2 and image plane IP. An example material for windows WA and WB is fused silica.

The example system 10 has a four-die format at i-line LED wavelength or GHI-s spectral bands, and a NA=0.32. The four-die format means that the object fields and image fields can cover 4 die that have nominal dimensions of 26 mm×36 mm. The field size (at the image plane IP or object plane OP) is 66 mm×52 mm and has 73% transmission. The concave surface of lens element L4 is an aspheric surface. Likewise, mirror surface MS is an aspheric surface. It is noted here that the object and image fields are the same size since system 10 is a 1× magnification system.

The system 10 has a working distance WD of 5 mm, a focal distance FD of 5 mm, a fold angle $\theta_F$ of 103.5, an unfolded length (object plane OP to primary mirror vertex) of 1,212.5 mm, aperture stop AS with a clear aperture of 596.2 mm and a primary mirror diameter of 620 mm with a thickness of 150 mm. Prisms PA and PB have a path length of 105 mm. The two aspheric surfaces are lens surface LS4 of lens L4 and on mirror surface MS of primary mirror M1, and are $12^{th}$-order aspheric surfaces, as noted in the aspheric equation for sag as set forth below.

Table 3 below sets forth an example lens design prescription for the first example system 10. The dimensions are in millimeters.

TABLE 3

| S# | Comment | Radius | Thickness | Glass | Semi-Diameter |
|---|---|---|---|---|---|
| 1 | 0.32NA OBJECT PLANE (OP) | | 0.000 | | 86.006 |
| 2 | OBJ WORKING DISTANCE | | 5.000 | | 93.506 |
| 3 | PROTECTION WINDOW (WA) | | 1.000 | F-SILICA | 95.295 |
| 4 | AIRSPACE | | 1.000 | | 95.529 |
| 5 | PRISM ENT FACE (PA2) | | 105.000 | PBL1Y | 95.887 |
| 6 | TIR FACE (TA) | | 0.000 | MIRROR | 143.761 |
| 7 | PRISM EXIT FACE/AIRSPACE | | −2.580 | | 118.842 |
| 8 | EL#1 BICX (lens L1) | 4946.059 | −43.113 | S-FPL51Y | 125.000 |
| 9 | AIRSPACE | 212.390 | −0.455 | | 125.000 |
| 10 | EL#2 NMNSC (lens L2) | 211.329 | −22.453 | PBL1Y | 125.000 |
| 11 | AIRSPACE | 706.726 | −9.706 | | 135.000 |
| 12 | EL#3 PMNSC (lens L3) | 2333.382 | −45.977 | S-FPL51Y | 148.000 |
| 13 | AIRSPACE | 1145.335 | −95.049 | | 148.000 |
| 14 | EL#4 PMNSC ASPH (Lens L4) | 829.033 | −41.202 | PBL1Y | 172.000 |
| 15 | AIRSPACE | 454.819 | −839.951 | | 177.500 |
| 16 | 0.32NA APER STOP AS | — | — | — | 298.107 |
| 17 | PRIMARY MIRROR ASPH | 1214.617 | 839.951 | MIRROR | 310.000 |
| 18 | RETURN IMAGE PATH | — | — | — | |
| 19 | EL#4 RETURN (Lens L4) | 454.819 | 41.202 | PBL1Y | 177.500 |
| 20 | AIRSPACE | 829.033 | 95.049 | | 172.000 |
| 21 | EL#3 RETURN (Lens L3) | 1145.335 | 45.977 | S-FPL51Y | 148.000 |
| 22 | AIRSPACE | 2333.382 | 9.706 | | 148.000 |
| 23 | EL#2 RETURN (Lens L2) | 706.726 | 22.453 | PBL1Y | 135.000 |
| 24 | AIRSPACE | 211.329 | 0.455 | | 125.000 |
| 25 | EL#1 RETURN (Lens L1) | 212.390 | 43.113 | S-FPL51Y | 125.000 |
| 26 | AIRSPACE | 4946.059 | 2.580 | | 125.000 |
| 27 | PRISM ENT FACE | | 0.000 | PBL1Y | 118.842 |
| 28 | TIR FACE (TB) | | −105.000 | MIRROR | 143.762 |
| 30 | PRISM EXIT FACE-AIRSPACE | | −1.000 | | 95.887 |
| 31 | PROTECTIVE WINDOW (WB) | | −1.000 | F-SILICA | 95.529 |
| 32 | IMAGE BACK FOCUS DISTANCE | | −5.000 | | 95.295 |
| 33 | IMAGE PLANE, WAFER (IM) | | 0.000 | | 86.006 |

Prisms PA and PB have an isosceles geometry with apex angles of 51.75°, 76.5° and 51.75'; a height of 85.1274 mm; TIR surfaces TA, TB of 133.70398 mm; entrance/exit faces P1 and P2 of 52.7019 mm; a fold angle $\theta_F$=103.5°; and an image plane tilt about X: +0.60 μm over a 52-mm image height. The depth of focus is the same as the depth of field and is 3 μm.

The aspheric surfaces LS4 and MS are defined as follows using the sag Z, wherein c=1/R, R being the base radius of curvature, ρ is the polar radius about the Z-axis, r is a radial coordinate, k is the conic constant and $\alpha_i$ is the $i^{th}$ aspheric coefficient. The sag Z is the displacement in the direction of optical axis A1 measured from the polar tangent plane.

$$Z=c^2/((1+\mathrm{SQRT}(1-(1+k)c^2/r^2)))+\alpha_1 r^2+\alpha_2 r^4+\alpha_3 r^6+\alpha_4 r^8+\alpha_5 r^{10}+\alpha_6 r^{12}$$

Table 3 below sets forth the aspheric data for the two aspheric surfaces LS4 and MS.

TABLE 3

Aspheric data

| Surface | k | $\alpha_2$ | $\alpha_3$ | $\alpha_4$ | $\alpha_5$ | $\alpha_6$ |
|---|---|---|---|---|---|---|
| 14 (LS4) | 0 | 5.6040E−10 | 1.3502E−15 | −1.5854E−20 | 7.4217E−25 | −7.8041E−30 |
| 17 (MS) | 0 | −8.5462E−13 | 1.1996E−18 | −2.9985E−23 | 2.6641E−28 | −9.0952E−34 |

Figure 2C:
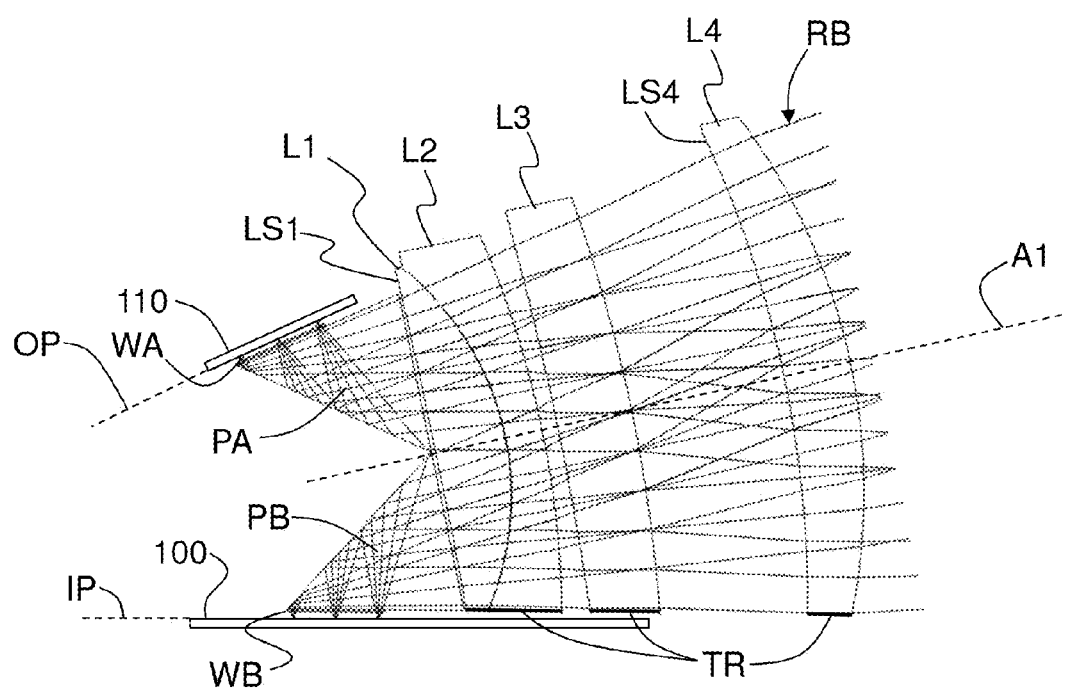
FIG. 2C is a close-up side view similar to that of FIG. 2B and shows the two prisms and the air-spaced lens elements for the first example embodiment, along with ray bundles that converge at the image and object planes where the wafer and reticle respectively reside.

FIG. 2C is a close-up side view similar to that of FIG. 2B and shows prisms PA and PB and lens elements L1 through L4. Ray bundles RB are shown that converge at the image and object planes IP and OP. Lens elements L1 through L4 are air-spaced. The lens surface LS1 of lens element L1 is adjacent prism surfaces PA1 and PB1. The lens surface LS1 is slightly concave and in an example has a radius of curvature selected for optimum optical performance of system 10. Lenses L1 and L4 are truncated at the bottom (solid line, denoted TR) so that a 300-mm wafer 100 can be used in image plane IP. A reticle (photomask) 110 is arranged in the object plane OP. An example reticle 110 is 0.25" (6-mm) thick. The focal distance FD of 5 mm provides a 3-mm clearance to accommodate a pellicle (not shown) on reticle 110. Windows WA and WB are used to protect the system optics from volatile organic compounds and outgassing damage.

Figure 3A:
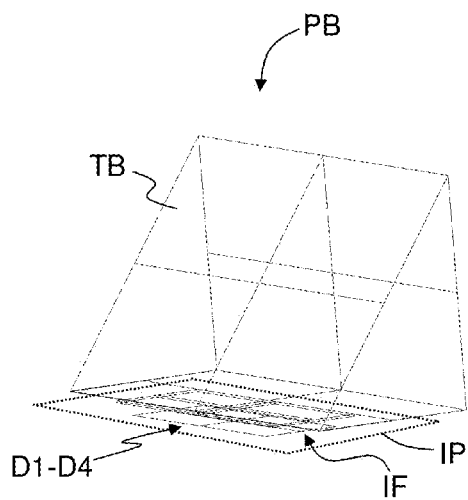
FIG. 3A is a close-up elevated view of an example prism that shows the image plane, the image field, and four die residing in the image field at the image plane for the first example embodiment.
Figure 3B:
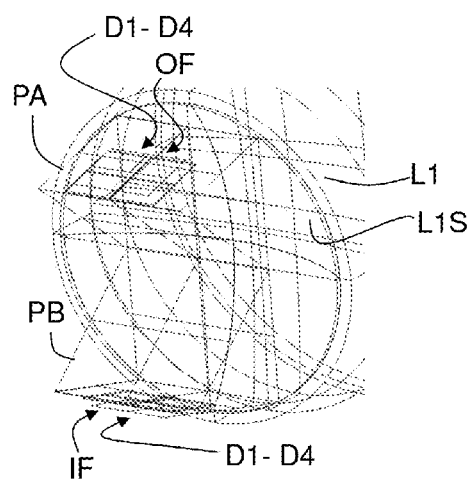
FIG. 3B is a close-up view of both prisms and the first lens element and shows the four-die size of the image and object fields for the first example embodiment.

FIG. 3A is an elevated close-up view of an example prism PB that shows the image plane IP and four die D1 through D4 residing in an image field IF formed at the image plane. FIG. 3B is an elevated close-up view similar to FIG. 3A that shows both prisms PA and PB and the adjacent lens L1 with lens surface LS1. Die D1 through D4 are shown relative to both prism PA and prism PB, as a die on reticle 110 (not shown) is the same size as the die imaged onto wafer 100 (not shown).

Figure 3C:
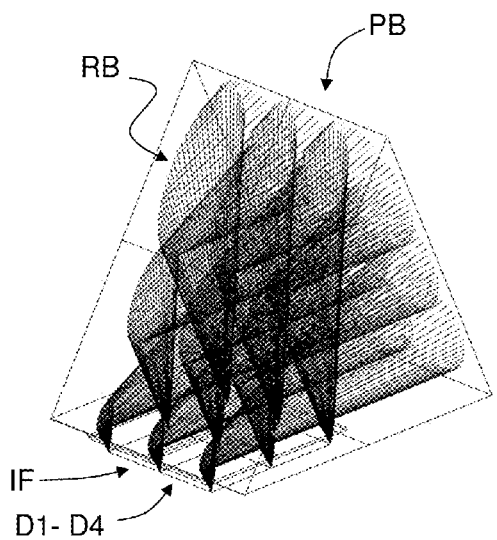
FIG. 3C is similar to FIG. 3A and shows ray bundles that converge at the corners of the four die in the image field for the first example embodiment.
Figure 3D:
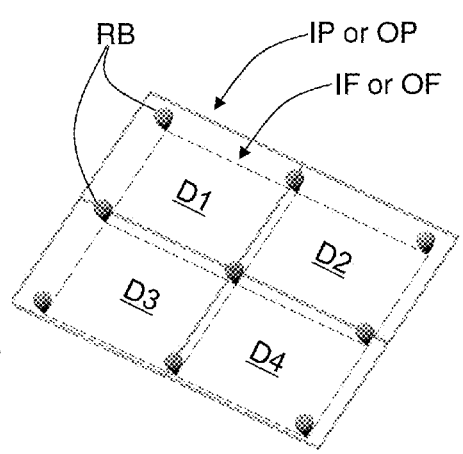
FIG. 3D shows the four die with the image or object field and shows the converging (or diverging) portions of the ray bundles associated with the corners of the four die for the first example embodiment.

FIG. 3C is similar to FIG. 3A and includes ray bundles RB that are focused at image plane IP over image field IF. FIG. 3D shows the four die D1 through D4 in image field IF of image plane IP (or in an object field OF of object plane OP) and also shows the focus of nine ray bundles RB at the corners of the four die. The four die D1 through D4 are shown residing in either image field IF or object field OF. Note that the term "die" is used to indicate a die pattern on reticle 110 or wafer 100 for ease of illustration and discussion.

Figure 4:
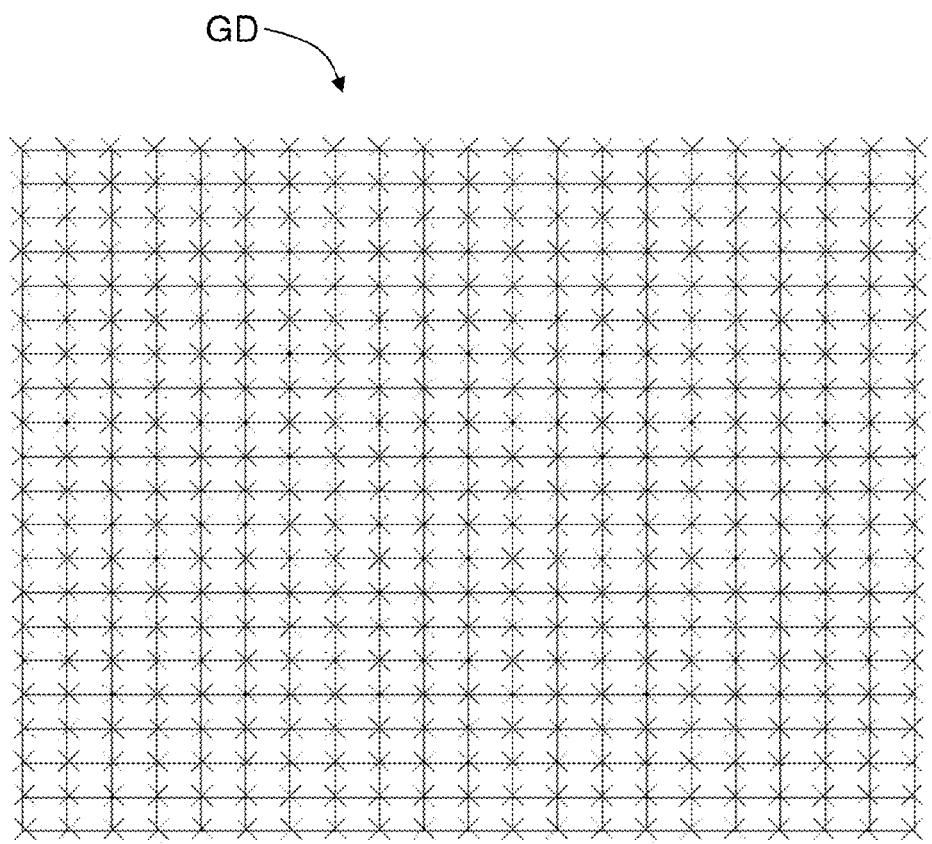
FIG. 4 is a plot of the grid distortion for the first example embodiment.

FIG. 4 is a plot of grid distortion GD, wherein "X" denotes the chief ray position relative to a perfect grid. The grid distortion GD in FIG. 4 is magnified by 340,000×. The small squares in the plot have actual dimensions of 10 nm (horizontal) by 7.6 nm (vertical).

Figure 5A:
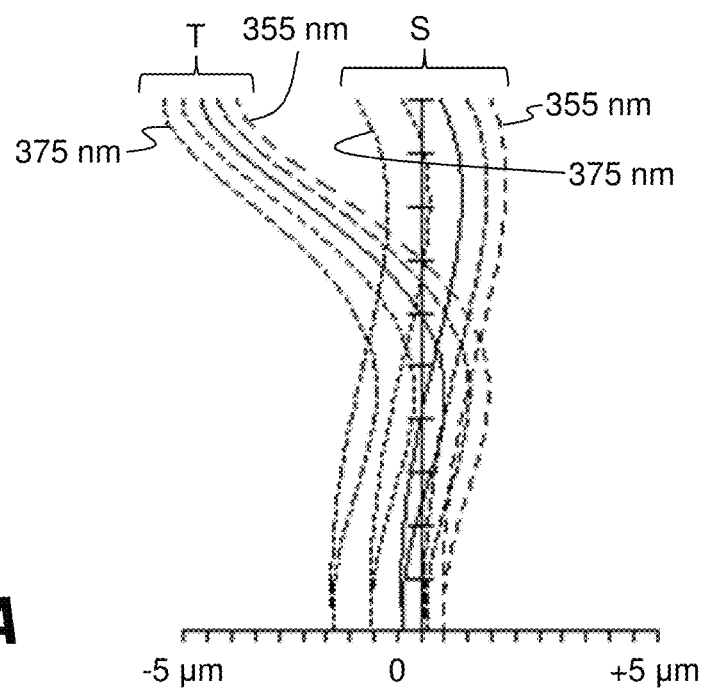
FIG. 5A is a plot of the field curvature/astigmatism for tangential rays T and sagittal rays S for different wavelengths (355 nm to 375 nm in 5-nm increments) for the first example embodiment.
Figure 5B:
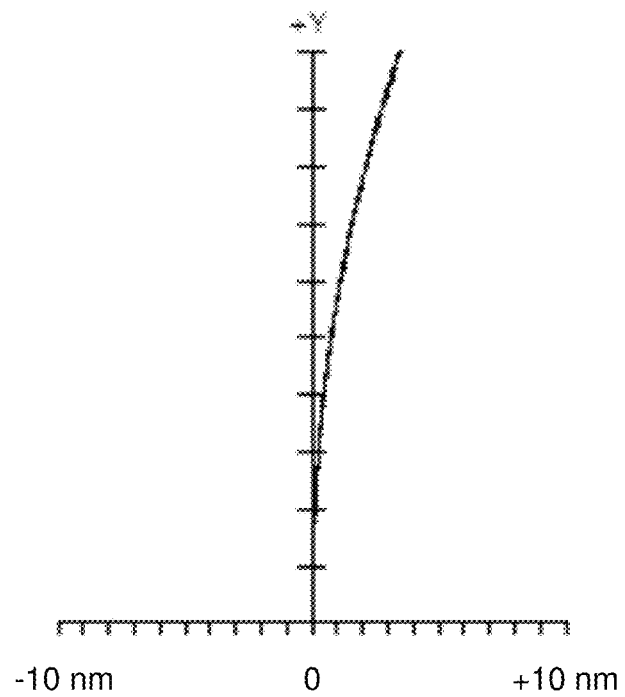
FIG. 5B is a plot of the distortion (mm) as a function of field height (maximum 79 mm) for the first example embodiment.

FIG. 5A is a plot of the field curvature/astigmatism for tangential rays T and sagittal rays S. The maximum field is 79 mm. The curves represent the different wavelengths from 355 nm through 375 nm in 5-nm increments. FIG. 5B is a plot of the distortion (in mm) as a function of field height (maximum 79 mm). In FIG. 5B, the curves for the different wavelengths overlap.

Figure 6A:
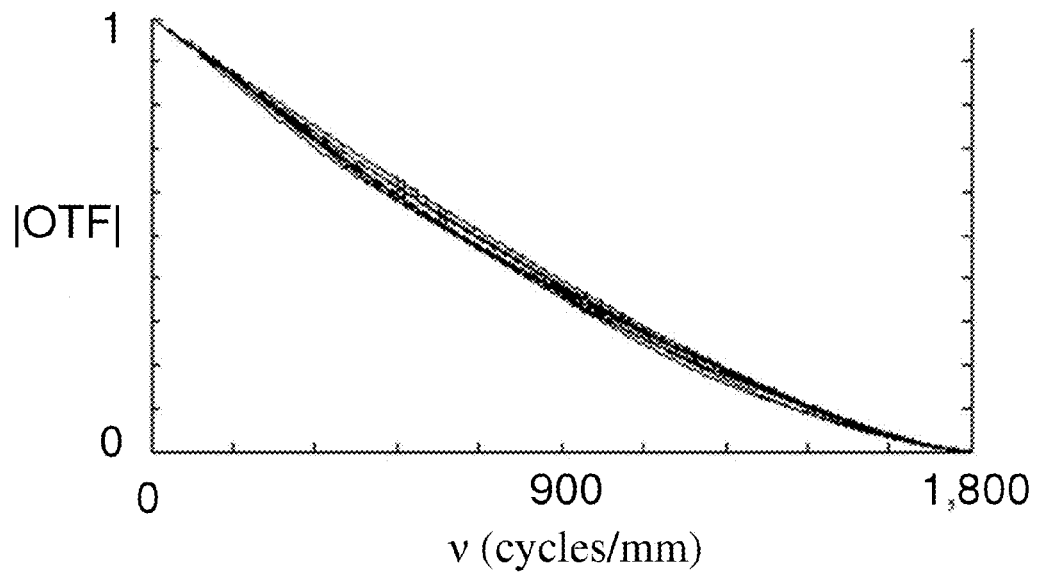
FIG. 6A is a plot of the polychromatic MTF for the first example embodiment.

FIG. 6A is a plot of the polychromatic MTF (modulus of the optical transfer function or IOTFI) versus spatial frequency ν (cycles/mm) for wavelengths from 355 nm to 375 nm and different field positions. The closeness of the curves for the different wavelengths indicate that the MTF for the different wavelengths and different field positions is high. The plot shows that the example system 10 is diffraction limited, with a cut-off frequency of 1,800 cycle/mm.

Figure 6B:
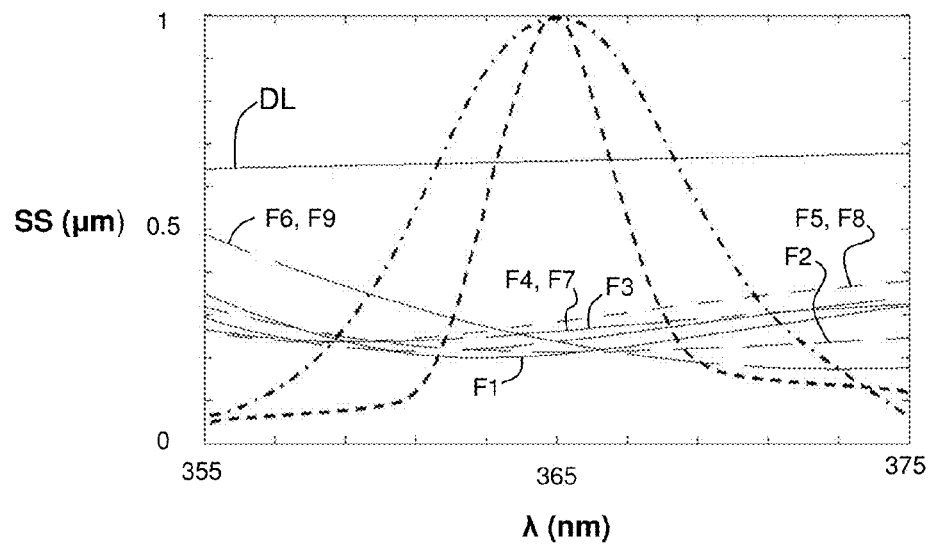
FIG. 6B is a plot of the polychromatic RMS spot size (μm) versus wavelength λ (nm) and field position for the first example embodiment.

FIG. 6B is a plot of the polychromatic RMS spot size SS (μm) versus wavelength λ (nm) and field positions F1 through F9 as noted in Table 4, below. The field size is 79 mm.

TABLE 4

Field positions F1-F9

| FIELD | X (mm) | Y (mm) |
|---|---|---|
| F1 | 0 | −27 |
| F2 | 0 | −53 |
| F3 | 0 | −79 |
| F4 | −34 | −27 |
| F5 | −34 | −53 |
| F6 | −34 | −79 |
| F7 | 34 | −27 |
| F8 | 34 | −53 |
| F9 | 34 | −79 |

The dashed line represents the Hg-arc spectrum while the dashed-dotted line represents the i-line LED spectrum. The diffraction-limit line is denoted DL and the diffraction limit radius is 0.65 μm. At 365 nm the design RMS radius is about ⅓ of the diffraction limit.

Figure 7A:
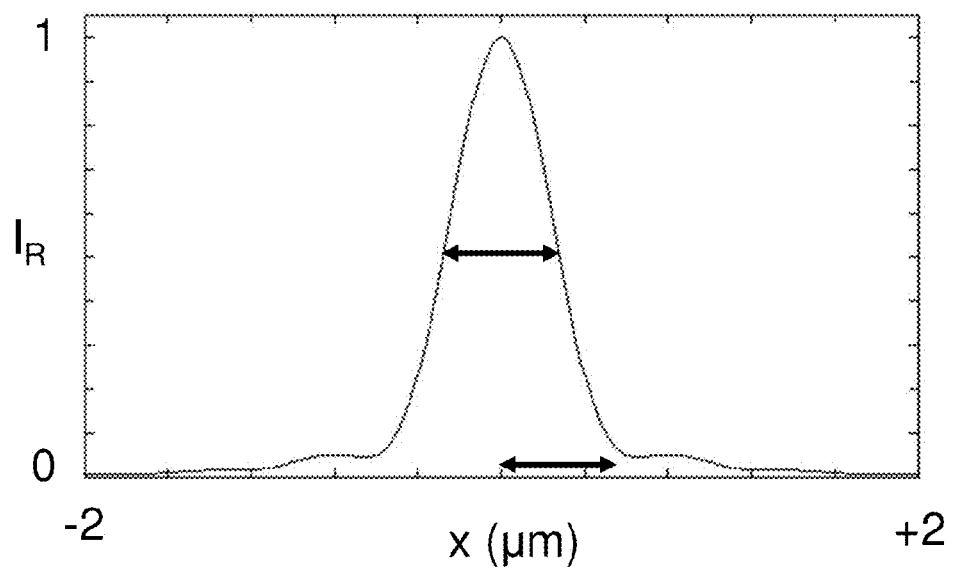
FIG. 7A is the Fourier polychromatic i-line LED linespread function and shows a full-width half-max (FWHM) of 0.55 μm for the first example embodiment.

FIG. 7A is the Fourier polychromatic i-line LED line-spread function plotted as relative irradiance $I_R$ versus x(μm) and shows a full-width half-max (FWHM) of 0.55 μm.

Figure 7B:
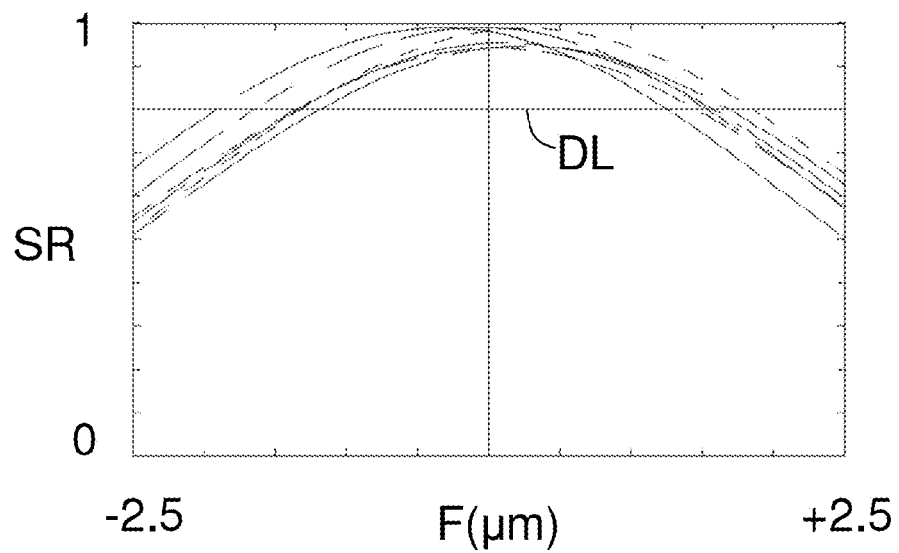
FIG. 7B is the through-focus Strehl ratio versus field position at the i-line (365 nm) wavelength for the first example embodiment.

FIG. 7B is a plot of the Strehl ratio SR versus focus F (μm) for different field positions at the i-line (365-nm) wavelength. The design goal is a Strehl of 0.95 or greater over the depth of focus.

Figure 8A:
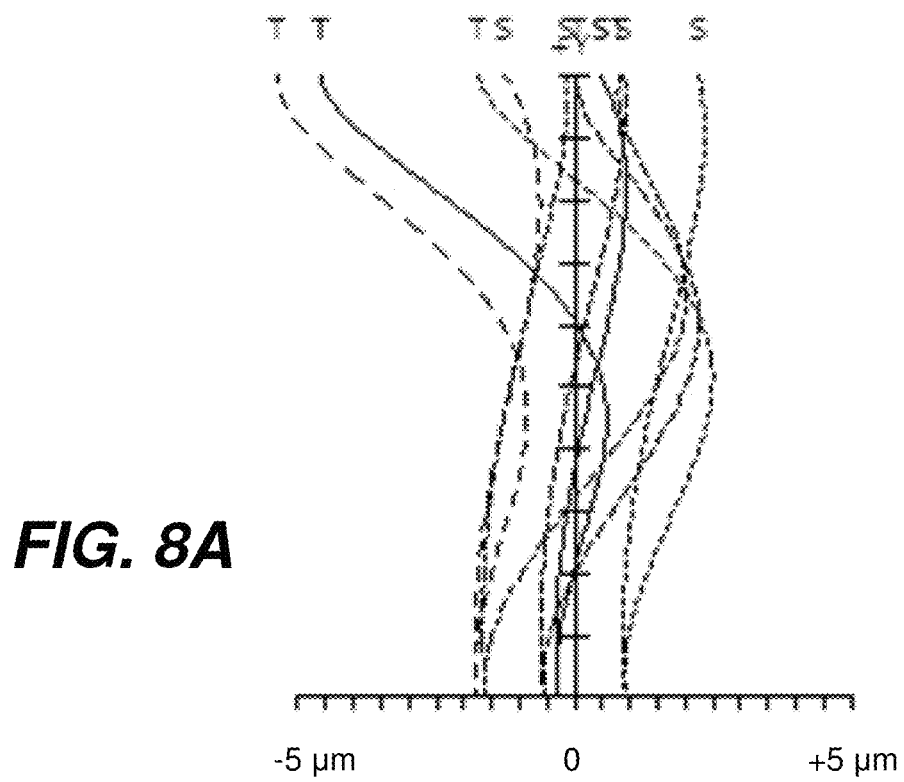
FIGS. 8A and 8B are similar to FIGS. 5A and 5B and show the field curvature and distortion for the GHI-s spectral band for the first example embodiment.
Figure 8B:
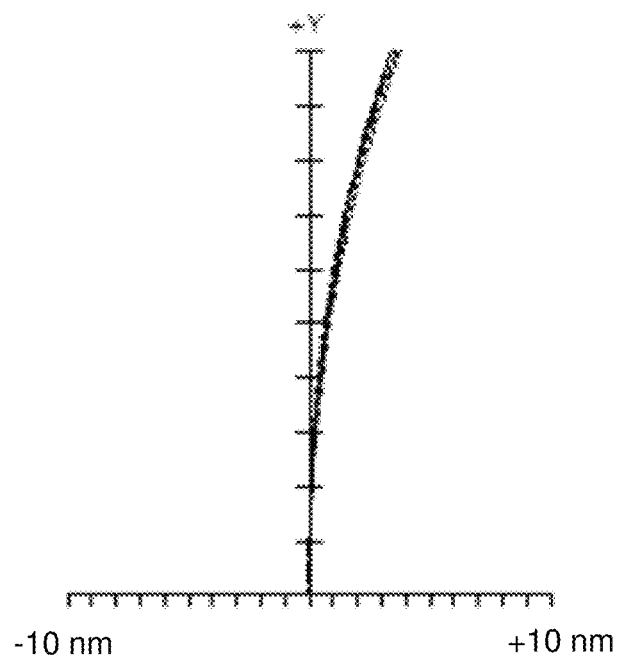

FIGS. 8A and 8B are similar to FIGS. 5A and 5B and show the field curvature and distortion for the GHI-s spectral band.

Figure 9A:
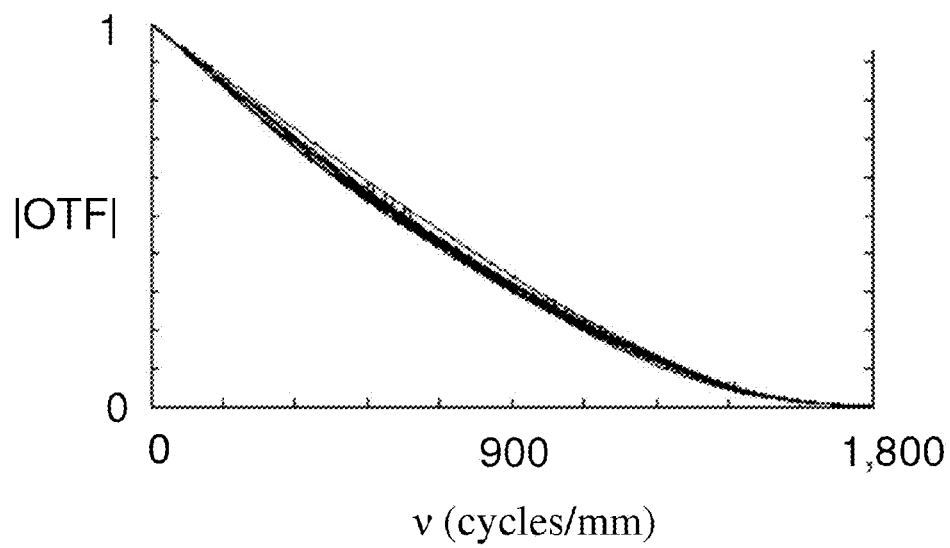
FIG. 9A is the similar to FIG. 6A and is the polychromatic MTF for wavelengths in the range from 355 nm to 450 nm for the first example embodiment.

FIG. 9A is the similar to FIG. 6A and is the polychromatic MTF for wavelengths in the range from 355 nm to 450 nm, and for spatial frequencies from 0 to 1,800 cycles/mm.

Figure 9B:
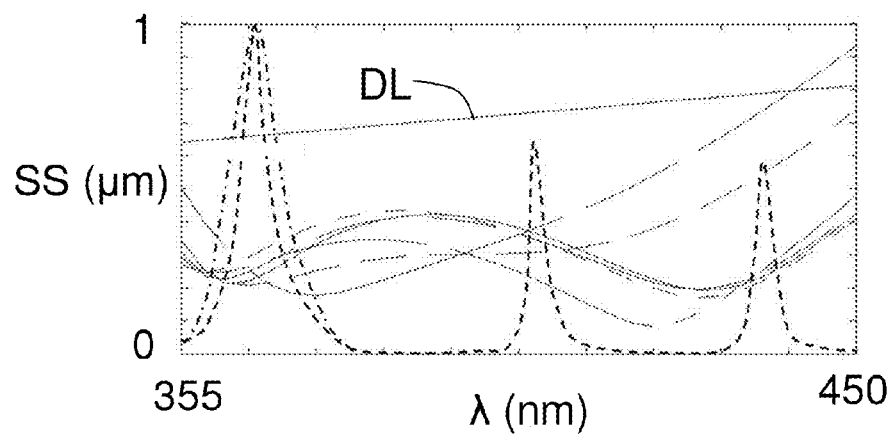
FIG. 9B is similar to FIG. 6B and shows the polychromatic RMS spot radius (μm) versus wavelength (μm) and field position for Hg-arc wavelengths (dashed line) and LED wavelengths (dashed-dotted line) for the first example embodiment.

FIG. 9B is similar to FIG. 6B and shows the polychromatic RMS spot radius SS (μm) versus wavelength λ (nm) for various field positions for Hg-arc wavelengths (dashed line) and LED wavelengths (dashed-dotted line). The diffraction-limited radius is 0.7 μm, and at 405 nm the design RMS radius is about ½ of the diffraction limit.

Figure 10A:
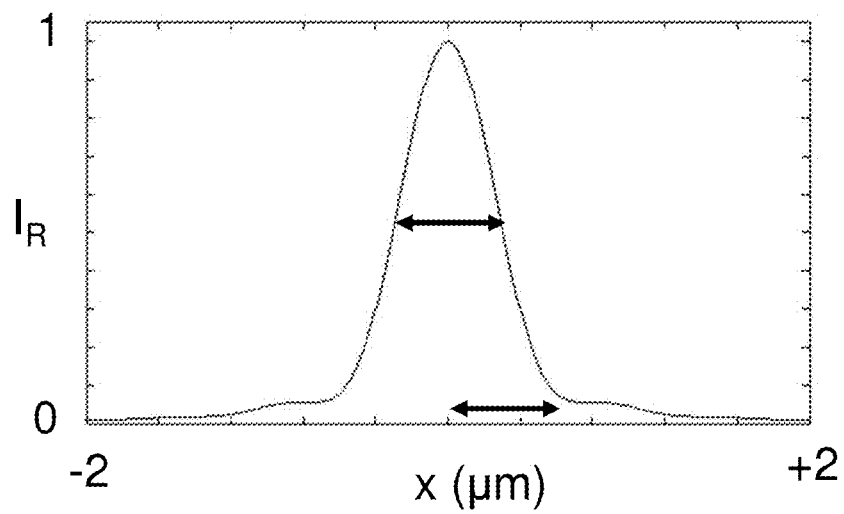
FIG. 10A is similar to FIG. 7A and is the Fourier linespread function and shows a FWHM of about 6 μm for the first example embodiment.

FIG. 10A is similar to FIG. 7A and is the Fourier line spread function, showing a FWHM of about 6 μm.

Figure 10B:
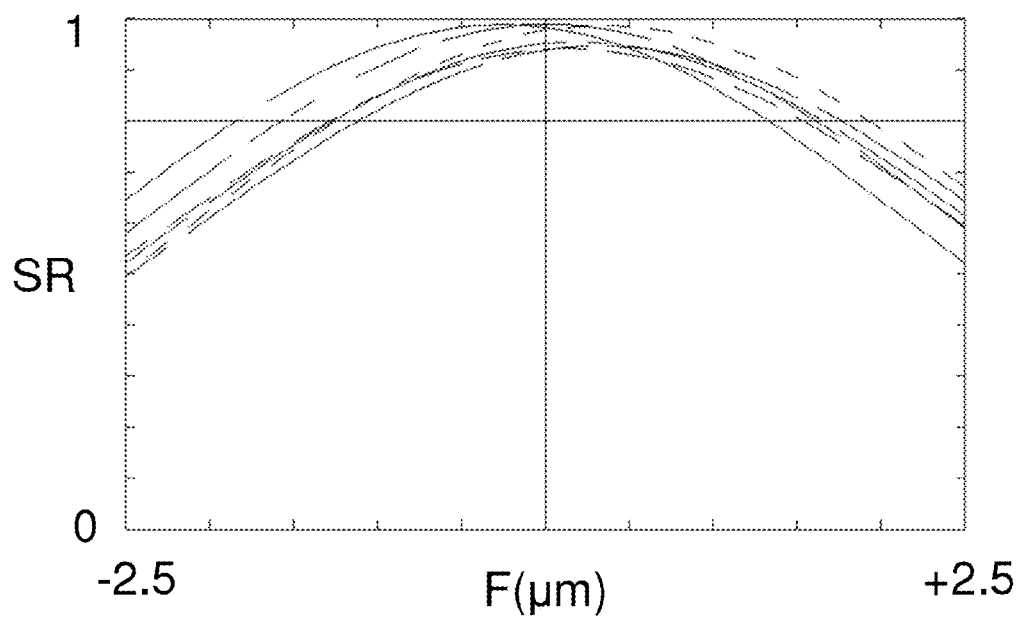
FIG. 10B is similar to FIG. 7B and is a plot of the Strehl ratio through focus at the h-line of 405 nm, with the goal of 0.95 or greater through the depth-of-focus range for the first example embodiment.

FIG. 10B is similar to FIG. 7B and is a plot of the Strehl ratio through a focus at the h-line of 405 nm, with the goal of 0.95 or greater through the depth-of-focus range.

Characteristics and Advantages of the First Embodiment

The first example embodiment of system 10 has a number of characteristics and advantages that are summarized below.

The medium NA of 0.32 provides line widths and spot sizes less than 0.75 μm at i-line wavelength, and line widths and spot sizes less than 2 μm at GHI-s broad-band exposure.

The four-die format size of 68 mm×52 mm increases the wafer/hour exposure rate up to 4× by exposing four dice per exposure step as compared with only a single die.

The design is based on supporting TIR in the field-separation prisms PA and PB while maximizing the spectral transmission of their long optical paths.

The depth of focus allows for a ~3-μm residual wafer bow of vacuum flattened wafers 100.

The system 10 supports the i-line LED spectrum, which is double the bandwidth of the Hg-arc spectrum.

The system 10 supports GHI-s exposure with an Hg-arc source or multi-wavelength LED sources.

The example design utilizes the highest quality i-line glasses for maximum transmission and refractive-index homogeneity.

The system 10 avoids the higher-cost fused-silica when i-line optical glass types provide the additional benefit of a higher refractive index, sufficient internal transmission and superior do/dT behavior (e.g., less sensitivity to temperature gradients);

The aspheric surfaces are limited to two concave optical surfaces LS4 and MS to minimize departure from a best-fit-sphere to facilitate testing in manufacture that can take into account gravitational self-weight bending of optics (lenses and mirror) in their "as used" attitude.

The air-spacing of refractive lens elements L1 through L4 obviates the use of optical adhesives that are susceptible to UV damage, thereby allowing for a longer system lifetime;

An example system 10 has the focal-plane tilt optimized to compensate for any residual tilt component of the Petzval curvature for off-axis field and emulates the actual system-alignment procedure.

The negligible optical distortion (e.g., <10 nm) ensures maximum overlay accuracy for a multi-die exposure.

The use of protective windows (which are replaceable) prevents damage to optics volatile organic compounds and outgassing associated with the photolithography process, e.g., from various photo-resists, etc., thereby promoting long service life and obviating the need to frequently clean or replace optical components, and permits "sealing" of the optical system to prevent the aforementioned contamination of the optics.

The large working and focus distance (5 mm) provide for sufficient physical clearance between the adjacent protective window and either the wafer or reticle pellicle. This keeps cosmetic defects caused by particulates from affecting exposure and creating process defects.

Second Example Embodiment

Figure 11A:
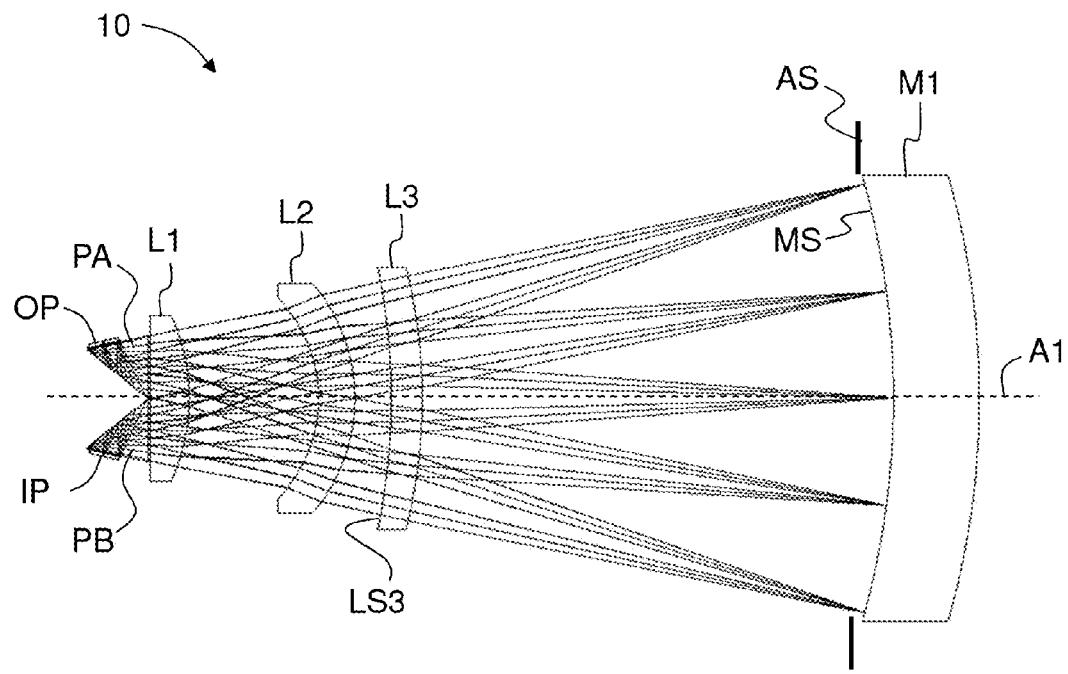
FIG. 11A is a diagram of a second example embodiment of the 1× modified Wynn-Dyson catadioptric optical system according to the disclosure

FIG. 11A is similar to FIG. 2A and illustrates a second example embodiment of system 10 that includes three air-spaced refractive lens elements L1, L2 and L3. The system 10 is configured to provide a six-die format at the i-line LED or GHI-s spectral bands. The field size is 102 mm×52 mm and has a transmission of 75% at the i-line wavelength. The working distance WD=6 mm. The system 10 includes the aforementioned windows WA and WB that in an example are 1 mm thick and made of fused silica. The fold angle $\theta_F$ is 103 degrees. The unfolded length is 1,417.5 mm. The aperture stop AS has a clear aperture of 749.8 mm, and primary mirror M1 has a clear aperture of 780 mm and is 175 mm thick. The prism path length is 107 mm. The lens L3 has a concave surface LS3 that is aspheric. Minor surface MS is also aspheric. The NA=0.32. The back focus distance FD is essentially the same as in the working distance WD due to the system symmetry.

Table 5 sets forth an example lens-design prescription for the second example system 10. The dimensions are in millimeters.

TABLE 5

| S# | Comment | R | Thickness | Glass | Semi-Diameter |
|---|---|---|---|---|---|
| 1 | 0.32NA OBJECT PLANE (OPP) | | 0.0000 | | 96.566 |
| 2 | OBJ WORKING DISTANCE (WD) | | 6.0000 | | 104.066 |
| 4 | PROTECTION WINDOW (WA) | | 1.0000 | F-SILICA | 106.343 |
| 4 | AIRSPACE | | 1.5000 | | 106.591 |
| 5 | PRISM ENT FACE | | 107.0000 | PBL35Y | 107.160 |
| 6 | TIR FACE (TA) | | 0.0000 | MIRROR | 151.237 |
| 7 | PRISM EXIT FACE-AIRSPACE | | −3.7640 | | 129.472 |
| 8 | EL#1 PLCX (L1) | 348.0068 | −68.0765 | F-SILICA | 145.000 |
| 9 | AIRSPACE | 251.5685 | −225.7860 | | 145.000 |
| 10 | EL#2 NMNSC (L2) | 309.5053 | −63.5867 | PBL35Y | 175.000 |
| 11 | AIRSPACE | 1124.9733 | −63.4603 | | 200.000 |
| 12 | EL#3 PMNSC ASPH (L3S) | 934.5878 | −54.0829 | PBL6Y | 230.000 |
| 13 | AIRSPACE | 1417.0000 | −823.2103 | | 230.000 |
| 14 | 0.32NA APER STOP (AS) | — | — | — | 374.913 |
| 15 | PRIMARY MIRROR ASPH | 1417.0807 | 832.2103 | MIRROR | 390.000 |
| 16 | RETURN PATH | — | — | — | — |
| 17 | EL#3 RETURN (L3) | 1124.9733 | 54.0829 | PBL6Y | 230.000 |
| 18 | ASPH - AIRSPACE | 309.5053 | 63.4603 | | 230.000 |
| 19 | EL#2 RETURN (L2) | 251.5685 | 63.5867 | PBL35Y | 200.000 |
| 20 | AIRSPACE | 348.0068 | 225.7860 | | 175.000 |
| 21 | EL#1 RETURN (L1) | | 68.0765 | F-SILICA | 145.000 |
| 22 | AIRSPACE | | 3.7640 | | 145.000 |
| 23 | PRISM ENT FACE | | 0.0000 | PBL35Y | 129.476 |
| 24 | TIR FACE (TB) | | −107.000 | MIRROR | 150.085 |
| 25 | PRISM EXIT FACE-AIRSPACE | | −1.5000 | | 103.790 |
| 26 | PROTECTIVE WINDOW (WB) | | −1.0000 | F-SILICA | 103.220 |
| 28 | IMAGE BACK FOCUS DISTANCE | | −6.0008 | | 102.973 |
| 29 | IMAGE PLANE (IP) | | 0.0000 | | 93.197 |

Prisms PA and PB are isosceles and have the following design parameters: Apex Angles: 51.5°, 77° and 51.5°; a height of 87.3504 mm; a length of 170.0 mm; and a TIR Base-width of 136.7224 mm. The focal plane tilt about X: ±0.40 μm over a 68-mm object & image height. The depth of focus=2.5 μm.

The aspheric surfaces are described using the sag equation set forth above, but with additional terms of $\alpha_7\rho^{14}$ and $\alpha_8\rho^{16}$. The aspheric data is set forth in Table 6, below.

TABLE 6

| S# | k | $\alpha_2$ | $\alpha_3$ | $\alpha_4$ | $\alpha_5$ | $\alpha_6$ | $\alpha_7$ | $\alpha_8$ |
|---|---|---|---|---|---|---|---|---|
| 12 (LS3) | 0 | 6.9262E−11 | 5.2170E−17 | −2.4905E−21 | 1.4863E−25 | −5.2515E−30 | 9.0087E−35 | −5.7562E−40 |
| 15 (MS) | 0 | −3.7538E−13 | −2.9662E−18 | 5.5504E−23 | −6.2595E−28 | 3.8523E−33 | −1.1861E−38 | 1.3622E−44 |

Figure 11B:
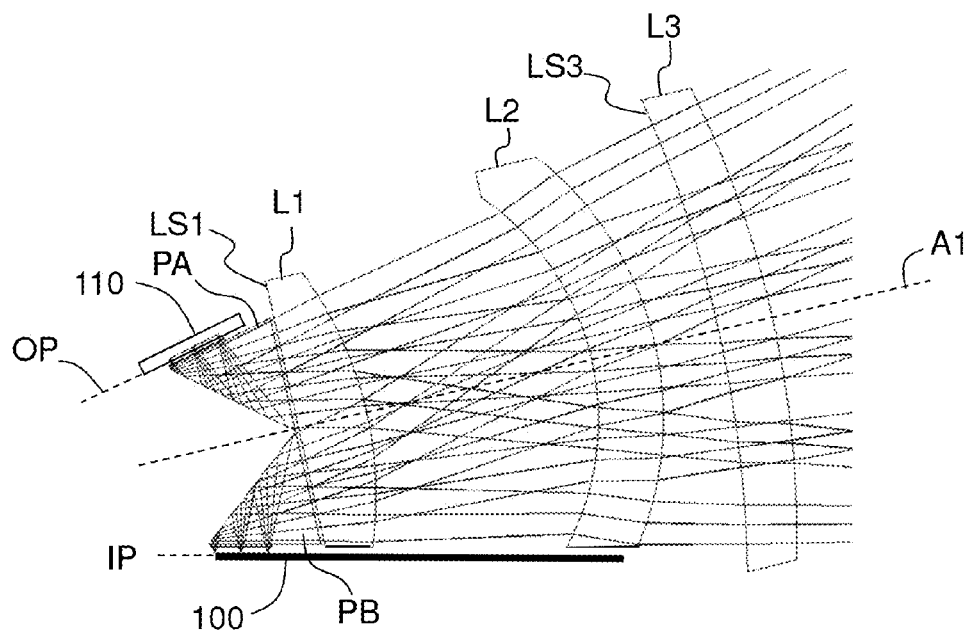
FIG. 11B is similar to FIG. 2C and shows prisms PA and PB, the three air-spaced lenses elements L1 through L 3, reticle 110 at object plane OP and wafer 100 at image plane IP.

FIG. 11B is similar to FIG. 2C and shows prisms PA and PB, the three air-spaced lenses elements L1 through L3, reticle 110 at object plane OP and wafer 100 at image plane IP. The lens surface LS1 of lens L1 that is adjacent prisms PA and PB is flat. Curvature on lens surface LS1 does not benefit this particular example design. Lenses L1 through L3 are truncated as discussed above to allow clearance for a 300-mm wafer 100. The reticle 110 at object plane OP is 0.25 mm thick. The focal distance FD of 6 mm provides a 4-mm clearance from the reticle pellicle (not shown).

Figure 12:
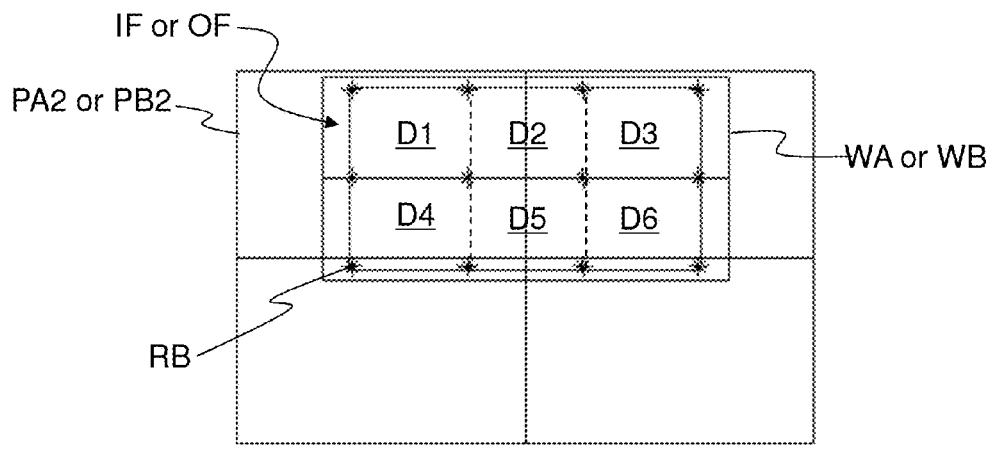
FIG. 12 is a schematic diagram that shows incident ray bundles at respective corners of the six dies at either the image field IF or the object field OF for the second example embodiment.

FIG. 12 is a schematic diagram that shows incident ray bundles RB at respective corners of dies D1 through D6 at either image field IF or object field OF. The large rectangular outline is the prism entrance/exit surface PA2 or PB2 at the object or image plane OP or IP. The smaller rectangle is either window WA or window WB.

Figure 13:
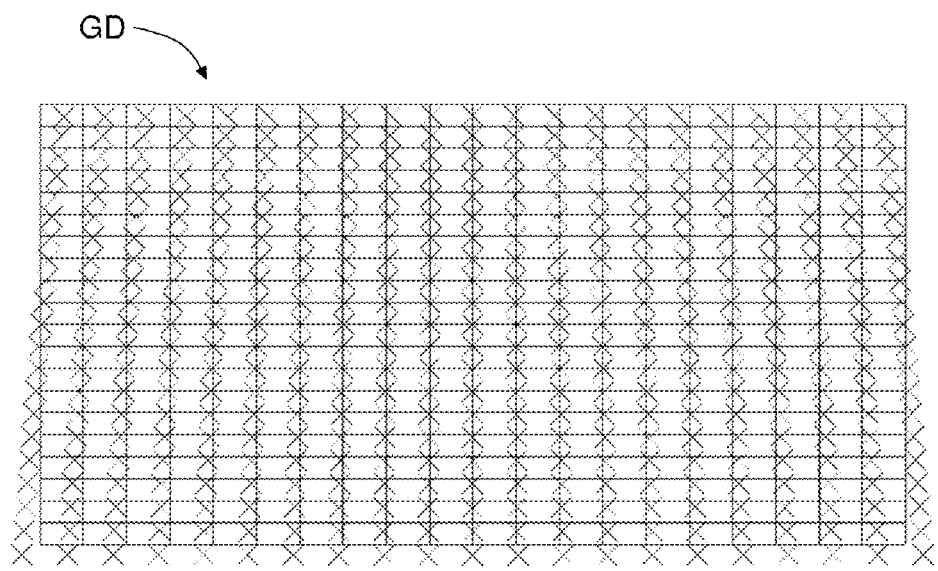
FIG. 13 is similar to FIG. 4 and shows a plot of the grid distortion for the second example embodiment.

FIG. 13 is similar to FIG. 4 and shows grid distortion GD with the "X" marks denoting the chief ray offset from the ideal grid. As in FIG. 4, the distortion errors are magnified by 510,000× so that they can be more easily seen. The squares in the plot are 10 nm (horizontal) by 5.1 nm (vertical).

Figure 14A:
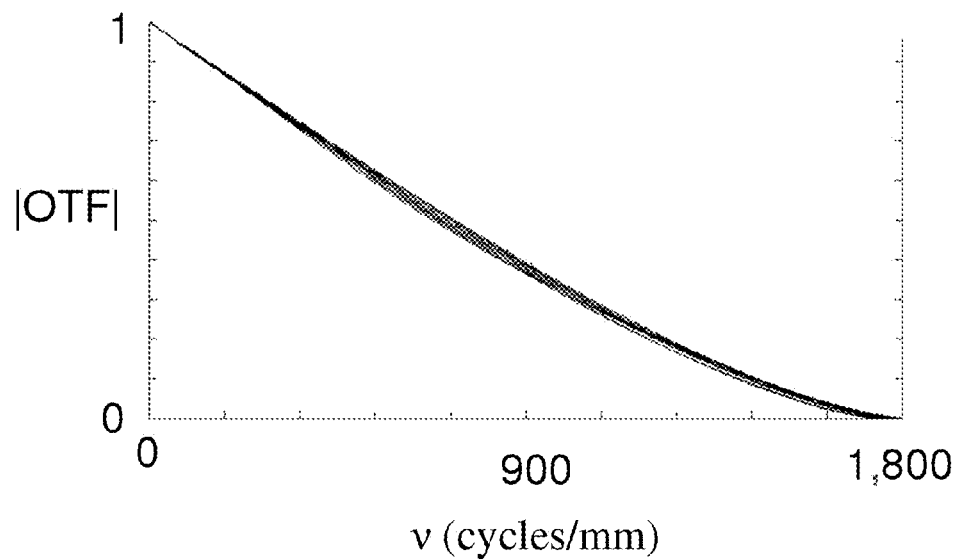
FIG. 14A is the polychromatic MTF plotted for wavelengths in the range from 355 nm to 375 nm for the second example embodiment.

FIG. 14A is similar to FIG. 9A and plots the polychromatic MTF for wavelengths in the range from 355 nm to 375 nm for various field positions. The system 10 of this second example is diffraction limited with a cut-off frequency of 1,800 cycles/mm. Again, the clustering of the different MTF curves shows good correction over the wavelength range and over image field IF.

Figure 14B:
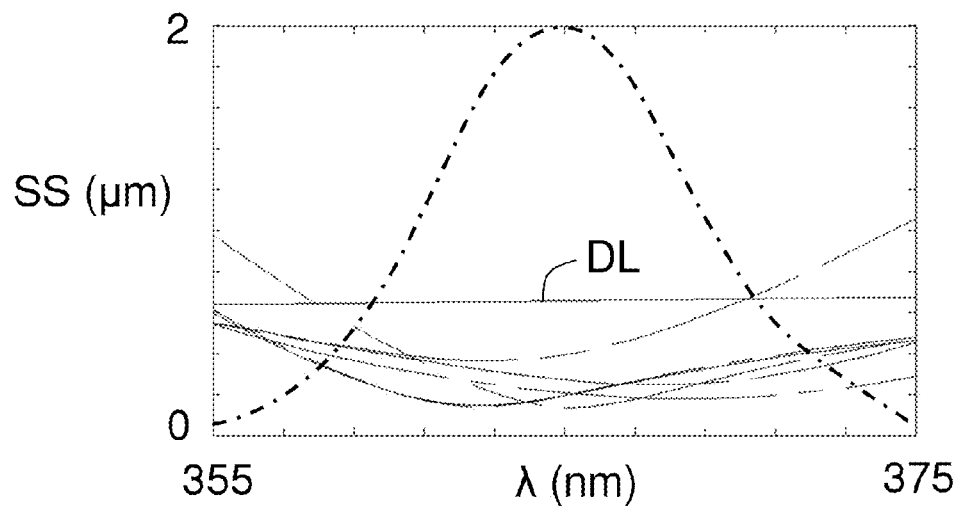
FIG. 14B is the polychromatic RMS spot radius (μm) versus wavelength (μm) and field position for the LED wavelength (dashed-dotted line) for the second example embodiment.

FIG. 14B is similar to FIG. 9B and plots the polychromatic RMS spot size SS (spot radius) (μm) versus wavelength λ (nm) for various field positions for the LED wavelength (dashed-dotted line). The diffraction-limit radius is 0.62 μm. At 365 nm, the design radius is about ⅓ of the diffraction limit.

Figure 15:
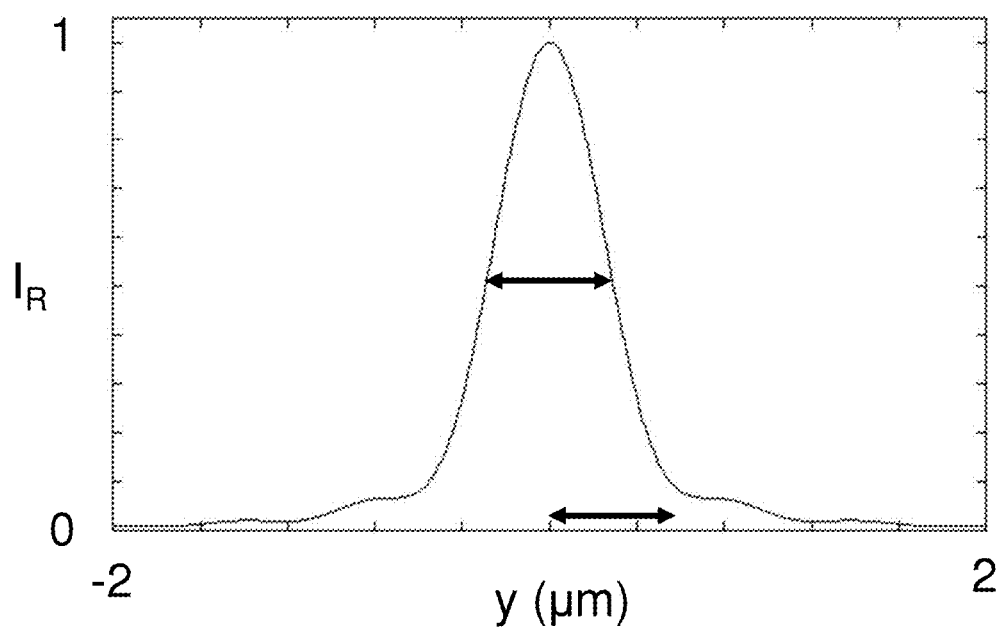
FIG. 15 is the Fourier polychromatic i-line LED linespread function and shows a FWHM linewidth of 0.48 μm for the second example embodiment.

FIG. 15 is similar to FIG. 10A and plots the Fourier polychromatic i-line LED line-spread function. The plot shows a FWHM linewidth of 0.48 μm.

Characteristics and Advantages of the Second Embodiment

The second example embodiment of system 10 has a number of characteristics and advantages that are summarized below.

The medium NA of 0.32 provides line widths and spot sizes less than 0.5 μm at the i-line wavelength.

The simplified design requires only three lens elements L1 through L3 in addition to field-separation prisms PA, PB and primary mirror M1.

The six-die format size of 102 mm×52 mm increases the wafer/hour exposure rate up to 6× by exposing six die per exposure step as compared with only a single die.

The design supports TIR in the field-separation prisms while maximizing the spectral transmission of their long optical paths.

The depth of focus allows for 3-μm residual wafer bow of vacuum flattened wafers 100.

The system 10 can operate over the i-line LED spectrum, which has about twice the bandwidth of the Hg-arc i-line spectrum.

The example system 10 utilizes a mix of the highest quality i-line glasses for maximum transmission and refractive-index homogeneity.

The system 10 requires only a single fused-silica lens element; the remaining two lens elements use i-line optical glass types, e.g., Ohara i-line optical glasses with reduced do/dT sensitivity, while providing achromatization of a broader i-line-LED spectral band compared to that of an Hg-arc lamp.

The two aspheric surfaces LS3 and MS are limited to concave optical surfaces to minimize departure from the best-fit-sphere to facilitate testing in manufacture that can take into account gravitational self-weight bending of optics (lenses and mirror) in their "as used" attitude.

The use of three air-spaced lens elements obviates the use of adhesives that are susceptible to UV damage.

The focal-plane tilt compensates for the residual tilt component of the Petzval curvature for an off-axis field and emulates the actual system-alignment procedure.

The negligible optical distortion (e.g., <10 nm) ensures maximum overlay accuracy for a multi-die exposure.

The use of protective windows WA, WB (which are replaceable) prevents damage to optics-volatile organic compounds and outgassing associated with the photolithography process, e.g., from various photo-resists, etc., thereby promoting long service life and obviating the need to frequently clean or replace optical components, and permits "sealing" of the optical system to prevent the aforementioned contamination of the optics.

The design provides for sufficient physical clearance between the adjacent protective window and either wafer 100 or the reticle pellicle. This keeps cosmetic defects caused by particulates from affecting exposures and creating process defects.

A small departure from otherwise perfect telecentricity is employed to allow conjugate focus shifting to adjust magnification by +/−10 microns to "fit" the multi-die format to wafer geometry to minimize overlay errors. The magnification of prior-art, telecentric unity-magnification, catadioptric relays cannot be varied.

It will be apparent to those skilled in the art that various modifications and variations can be made to the present disclosure without departing from the spirit and scope of the disclosure. Thus it is intended that the present disclosure cover the modifications and variations of this disclosure provided they come within the scope of the appended claims and their equivalents.

What is claimed is:

1. A microlithographic lens for imaging over an image field at an image plane a photomask that defines a plurality of die at an object plane, comprising along an optical axis:
    a concave mirror having an aspheric concave surface;
    a positive lens group spaced apart from the concave surface of the concave mirror;
    first and second total-internal-reflection (TIR) prisms disposed adjacent the positive lens group opposite the concave mirror and on respective sides of the optical axis, with the first prism having a first surface adjacent the object plane and the second prism having a second surface adjacent the image plane, wherein each prism has a refractive index of 1.5357 or greater at an i-line wavelength and respective TIR surfaces each having a phase-preserving coating;
    wherein the positive lens group consists of either three or four air-spaced lens elements, with one of the lens elements being a most mirror-wise lens element, having a positive meniscus shape and including a prism-wise concave aspheric surface; and
    wherein the image field is sized to include from four to six die, with each die having a nominal size of 26 mm×34 mm, the lens having substantially unit magnification at a numerical aperture of nominally 0.32, and wherein the lens has a Strehl ratio of >0.95 over the image field for at least an i-line wavelength of light.

2. The microlithographic lens of claim 1, further comprising a resolution of about 1 micron at a wavelength of 365 nm.

3. The microlithographic lens of claim 1, further comprising a resolution of about 2 microns for light having g-line, h-line and i-line wavelengths.

4. The microlithographic lens of claim 1, further comprising an amount of distortion that is less that 100 nm over the image field.

5. The microlithographic lens of claim 1, further comprising an amount of distortion that is less than 50 nm over the image field.

6. The microlithographic lens of claim 1, further comprising an amount of distortion that is less than 10 nm over the image field.

7. The microlithographic lens of claim 1, further comprising a depth of focus of about 3 microns or greater over the image field.

8. The microlithographic lens of claim 1, wherein the microlithographic lens images light over an i-line LED spectrum.

9. The microlithographic lens of claim 1, further comprising:
    a first protective window disposed between the object plane and the first TIR prism surface; and
    a second protective window disposed between the image plane and the second TIR prism surface.

10. The microlithographic lens of claim 9, wherein the protective windows are each made of fused quartz and have a thickness of about 1 mm.

11. The microlithographic lens of claim 1, wherein the lens has an amount of non-telecentricity that allows for the unit magnification to be adjusted by up to about 5 parts per million.

12. The microlithographic lens of claim 1, wherein one of the lens elements includes either a concave surface or a planar surface that resides immediately adjacent the first and second prisms.

13. The microlithographic lens of claim 1, wherein the image field size is nominally 68 mm×52 mm and accommodates four die.

14. The microlithographic lens of claim 1, wherein the image field size is nominally 102 mm×52 mm and accommodates six die.

15. A microlithographic lens for imaging over an image field at an image plane a photomask that defines a plurality of die at an object plane, comprising along an optical axis:
    a concave mirror having an aspheric concave surface;
    a positive lens group spaced apart from the concave surface of the concave mirror and consisting of three spaced-apart lens elements, including a most mirror-wise lens element having a positive meniscus shape and including a prism-wise concave aspheric surface;
    first and second total-internal-reflection (TIR) prisms disposed adjacent the positive lens group opposite the concave mirror and on respective sides of the optical axis, with the first prism having a first surface adjacent the object plane and the second prism having a second surface adjacent the image plane, wherein each prism has a refractive index of 1.5357 or greater at an i-line wavelength and respective TIR surfaces each having a phase-preserving coating; and
    wherein the image field is sized to include six die, with each die having a nominal size of 26 mm×34 mm, the lens having substantially unit magnification at a numerical aperture of nominally 0.32, and wherein the lens has a Strehl ratio of >0.95 over the image field for either an i-line LED wavelength spectrum or for g-line, h-line and i-line light.

16. The microlithographic lens of claim 15, wherein the lens has an amount of non-telecentricity that allows for the unit magnification to be adjusted by up to about 5 parts per million.

17. The microlithographic lens of claim 15, wherein the image field size is nominally 102 mm×52 mm.

18. A microlithographic lens for imaging over an image field at an image plane a photomask that defines a plurality of die at an object plane, comprising along an optical axis:
    a concave mirror having an aspheric concave surface;
    first and second total-internal-reflection (TIR) prisms disposed on respective sides of the optical axis, with the first prism having a first surface adjacent the object plane and the second prism having a second surface adjacent the image plane, wherein each prism has a refractive index of 1.5357 or greater at an i-line wavelength and respective TIR surfaces each having a phase-preserving coating;
    a positive lens group spaced apart from the concave surface of the concave mirror and between the prisms and the concave mirror, the positive lens group consisting of four spaced-apart lens elements, including a most mirror-wise lens element that has a positive meniscus shape and a prism-wise concave aspheric surface and a most prism-wise lens element that has a prism-wise concave surface that resides adjacent the prisms; and
    wherein the image field is sized to include four die, with each die having a nominal size of 26 mm×34 mm, the lens having substantially unit magnification at a numerical aperture of nominally 0.32, and wherein the lens has a Strehl ratio of >0.95 over the image field for either an i-line LED wavelength spectrum or for g-line, h-line and i-line light.

19. The microlithographic lens of claim 18, wherein the image field size is nominally 68 mm×52 mm.

20. The microlithographic lens of claim 18, further comprising an amount of distortion that is less than 10 nm over the image field.

* * * * *